(12) United States Patent
Blumhagen et al.

(10) Patent No.: US 8,896,307 B2
(45) Date of Patent: Nov. 25, 2014

(54) METHOD FOR DETERMINING MAGNETIC RESONANCE DATA

(75) Inventors: Jan Ole Blumhagen, Erlangen (DE); Matthias Fenchel, Erlangen (DE); Ralf Ladebeck, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 440 days.

(21) Appl. No.: 13/422,434

(22) Filed: Mar. 16, 2012

(65) Prior Publication Data

US 2012/0235680 A1    Sep. 20, 2012

(30) Foreign Application Priority Data

Mar. 17, 2011   (DE) .......................... 10 2011 005 728

(51) Int. Cl.
*G01R 33/44* (2006.01)
*G01R 33/565* (2006.01)
*G01R 33/48* (2006.01)

(52) U.S. Cl.
CPC ........ *G01R 33/481* (2013.01); *G01R 33/56572* (2013.01); *G01R 33/56563* (2013.01)
USPC ............................ 324/307; 324/309; 324/318

(58) Field of Classification Search
USPC ................................................. 324/300–322
See application file for complete search history.

(56) References Cited

U.S. PATENT DOCUMENTS

| | | | |
|---|---|---|---|
| 5,485,085 A | 1/1996 | Adler, Jr. | |
| 6,538,443 B2* | 3/2003 | Morich et al. | 324/318 |
| 6,897,655 B2* | 5/2005 | Brittain et al. | 324/309 |
| 6,967,479 B2* | 11/2005 | Polzin et al. | 324/318 |
| 7,109,711 B2 | 9/2006 | Kiefer | |
| 2009/0108843 A1 | 4/2009 | Gering | |
| 2012/0056621 A1* | 3/2012 | Blumhagen et al. | 324/309 |
| 2012/0146640 A1* | 6/2012 | Kusahara et al. | 324/309 |
| 2013/0082702 A1* | 4/2013 | Blumhagen et al. | 324/309 |

FOREIGN PATENT DOCUMENTS

DE   10326174 A1   1/2005
WO   WO 2010120829 A2   10/2010

OTHER PUBLICATIONS

Nagle S.K., Levin D.N.: Multiple Region MRI. In: Magn. Reson. Med., vol. 41, 1999, pp. 774-786; Others; 1999.
German Patent Office Communication.
German Priority Document for German Application No. DE 10 2011 005 728.5 (Not Yet Published).

* cited by examiner

*Primary Examiner* — Melissa Koval
*Assistant Examiner* — Rishi Patel
(74) *Attorney, Agent, or Firm* — Harness, Dickey & Pierce, P.L.C.

(57) ABSTRACT

According to an embodiment of a method, a first readout gradient field is determined in such a way that a distortion caused by a non-linearity of the first readout gradient field and a distortion caused by a $B_0$ field inhomogeneity are essentially cancelled at a first location of a field of view of the magnetic resonance facility. Moreover, a second readout gradient field is determined in such a way that a distortion caused by a non-linearity of the second readout gradient field and a distortion caused by a $B_0$ field inhomogeneity are essentially cancelled at a different second location of the field of view. Finally, a multiecho sequence is performed, wherein first magnetic resonance data is captured using the first readout gradient field after a 180° pulse and second magnetic resonance data is captured using the second readout gradient field after a further 180° pulse.

41 Claims, 5 Drawing Sheets

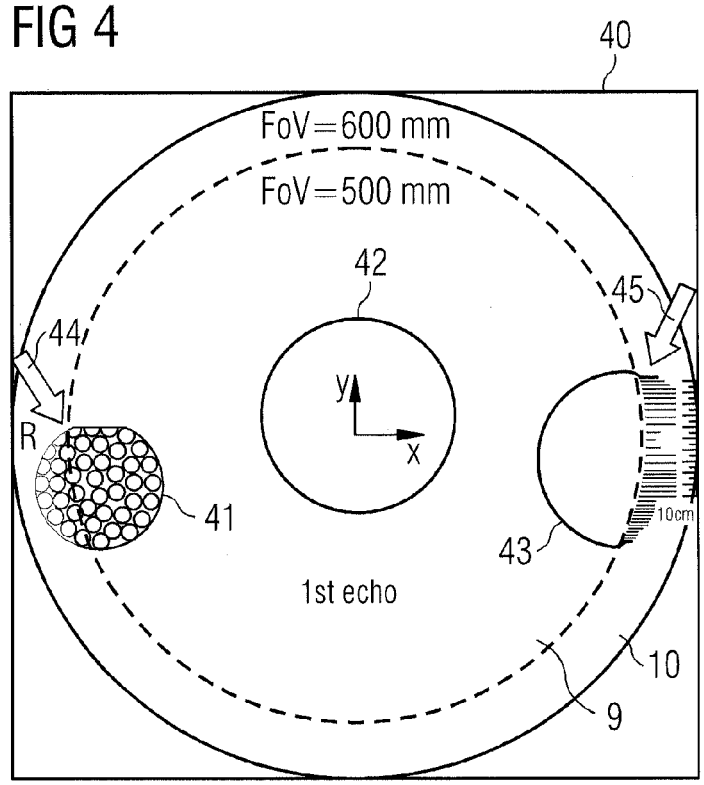
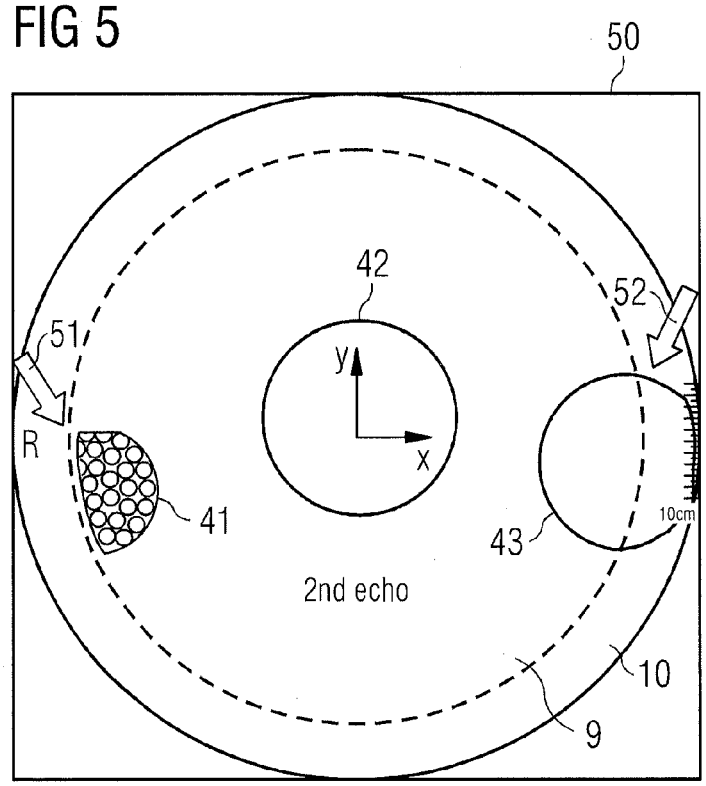

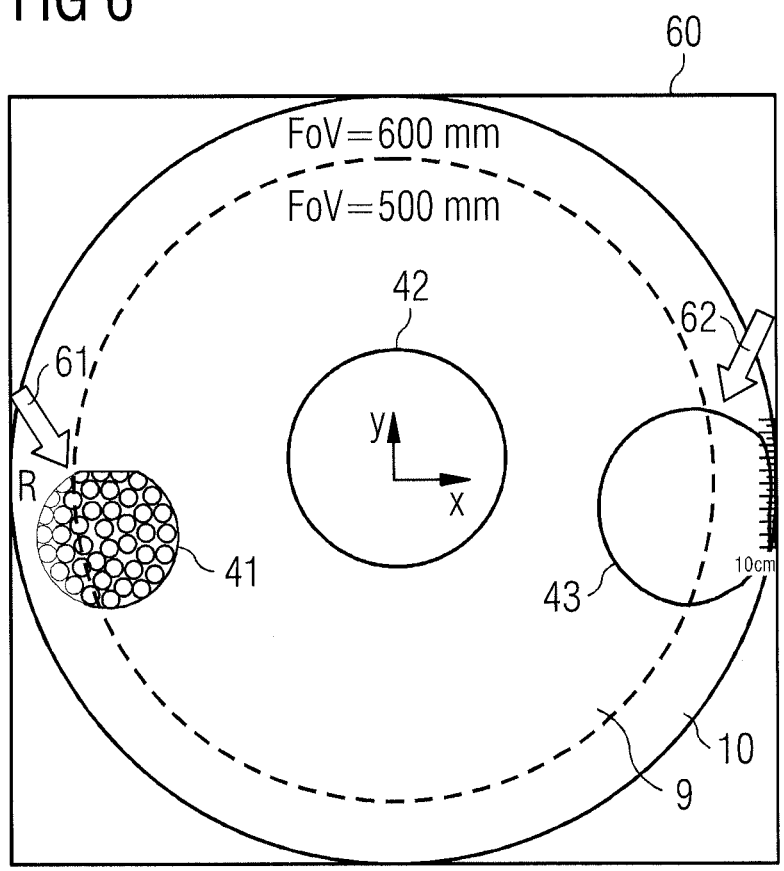

METHOD FOR DETERMINING MAGNETIC RESONANCE DATA

PRIORITY STATEMENT

The present application hereby claims priority under 35 U.S.C. §119 to German patent application number DE 10 2011 005 728.5 filed Mar. 17, 2011, the entire contents of which are hereby incorporated herein by reference.

FIELD

At least one embodiment of the present invention generally relates to a method for determining magnetic resonance data of an examination object in a magnetic resonance facility and/or a magnetic resonance facility for this purpose.

BACKGROUND

In magnetic resonance facilities, the volume that can be used for magnetic resonance tomography recordings within the tomograph is limited in all three spatial directions due to physical and technical conditions such as e.g. limited magnetic field homogeneity and non-linearity of the gradient field. A usable recording volume or so-called field of view (FoV) is therefore limited to a volume in which the above cited physical properties lie within predefined tolerance ranges, such that a true-to-original representation of the object to be examined is possible using normal magnetic resonance measurement sequences. In particular, this limited field of view is considerably smaller in an x-direction and a y-direction, i.e. perpendicularly relative to a longitudinal axis of a tunnel of the magnetic resonance facility, than the volume that is delimited by the tunnel of the magnetic resonance facility. In the case of conventional magnetic resonance facilities, the tunnel has a diameter in the range of 60-70 cm, whereas the diameter of the normally usable field of view (in which the above cited physical conditions are within the tolerance ranges) is approximately 10 cm smaller, i.e. in the range of 50-60 cm.

In many applications of magnetic resonance facilities, e.g. in the context of an image-based radiotherapy schedule or biopsy or in an MR-PET hybrid system, a true-to-original and spatially accurate representation of the examination object is nonetheless also required in the margin region between the above described normally usable field of view and the inner wall of the tunnel. In the case of MR-PET hybrid systems, e.g. magnetic resonance recordings are used to determine a human attenuation adjustment for subsequent calculation of a positron emission tomography recording (PET recording). Since regions of the examination object, e.g. the arms of a patient, can be arranged in the above described margin region between the normally usable field of view and the inner surface of the tunnel, precise knowledge of the arrangement of the examination object in the margin region is also required for the purpose of determining the attenuation adjustment for the PET recording.

Since the B0 field has inhomogeneities and the gradient field has non-linearities in the margin region, image points in the magnetic resonance recording appear at shifted positions. This spatial inaccuracy of the image points is also referred to as distortion. In the event of significant distortions in these margin regions, it is often impossible subsequently to compensate for the distortion in the magnetic resonance recording, since the distorted regions in the magnetic resonance recording overlap and therefore cannot be corrected subsequently.

SUMMARY

At least one embodiment of the present invention provides a spatially accurate and true-to-original representation of structures of an object that is to be examined in a region outside of the normally usable field of view, i.e. in a margin region of the tunnel of the magnetic resonance facility, for example. At least one embodiment of the present invention further addresses the problem of preventing significant distortions already at the instant the magnetic resonance data is captured.

According to at least one embodiment of the present invention, a method is disclosed for determining magnetic resonance data of an examination object in a magnetic resonance facility; a magnetic resonance facility is disclosed; a computer program product is disclosed; and/or an electronically readable data medium is disclosed. The dependent claims define preferred and advantageous embodiments of the invention.

According to at least one embodiment of the present invention, a method is provided for determining magnetic resonance data of an examination object in a magnetic resonance facility. Using the method, a first readout gradient field is determined in such a way that a distortion which is caused by a non-linearity of the first readout gradient field and a distortion that is caused by a B0 field inhomogeneity are essentially cancelled at a predetermined first location of the field of view of the magnetic resonance facility. Moreover, a second readout gradient field is determined in such a way that a distortion which is caused by a non-linearity of the second readout gradient field and a distortion that is caused by a B0 field inhomogeneity are essentially cancelled at a predetermined second location of the field of view. The first location and the second location are different locations.

According to at least one embodiment of the present invention, provision is further made for a magnetic resonance facility comprising a basic field magnet, a gradient field system, a high-frequency antenna and a control device. The control device activates the gradient field system and the high-frequency antenna. The control device also receives measurement signals that are picked up by the high-frequency antenna, and evaluates the measurement signals in order to produce magnetic resonance recordings. The control device is further configured to determine a first readout gradient field in such a way that a distortion which is caused by a non-linearity of the first readout gradient field and a distortion that is caused by a B0 field inhomogeneity are cancelled at a predetermined first location of the field of view of the magnetic resonance facility. Moreover, the control device is able to determine a second readout gradient field in such a way that a distortion which is caused by a non-linearity of the second readout gradient field and a distortion that is caused by a B0 field inhomogeneity are cancelled at a predetermined second location of the field of view. The first location and the second location are different. Finally, the control device is able to activate the components of the magnetic resonance facility in the form of a multispin echo sequence. In this case, first magnetic resonance data is captured using the first readout gradient field after a 180° pulse and second magnetic resonance data is captured using the second readout gradient field after a further 180° pulse.

According to an embodiment, the magnetic resonance facility also comprises a positron emission tomograph. In this case, the control device can be configured to determine an attenuation adjustment for a positron emission tomography recording as a function of a magnetic resonance recording that was produced on the basis of the first magnetic resonance data and the second magnetic resonance data.

Furthermore, the magnetic resonance facility can be configured to perform the method and its embodiments as described above and therefore also features the advantages described above.

Furthermore, at least one embodiment of the present invention makes provision for a computer program product, in particular a computer program or software, which can be loaded into a memory of a programmable control device of a magnetic resonance facility. Using the computer program product, it is possible to execute all or various of the above described embodiments of the inventive method when the computer program product runs in the control unit.

In this case, the computer program product might require programming resources such as libraries or help functions, for example, in order to realize the corresponding embodiments of the method. In other words, the claim relating to the computer program product is intended to include in the scope of protection in particular a computer program or software by which one of the above described embodiments of the inventive method can be executed and/or which executes said embodiment. In this case, the software can be a source code (e.g. C++) which remains to be compiled or translated and linked or which merely needs to be interpreted, or an executable software code which merely needs to be loaded into the relevant processing unit for execution.

Lastly, at least one embodiment of the present invention provides an electronically readable data medium, e.g. a DVD, a magnetic tape or a USB stick, on which is stored electronically readable control information, in particular software, as described above. When this control information and/or software is read from the data medium and stored in the processing unit, all of the inventive embodiments of the described method can be performed.

BRIEF DESCRIPTION OF THE DRAWINGS

Example embodiments of the invention will be described in more detail hereinafter, not to be understood in a limiting sense, with the aid of the drawings, wherein only the features necessary for the understanding of embodiments of the invention being shown, in which:

FIG. 4 shows a magnetic resonance recording that was determined on the basis of first magnetic resonance data in accordance with an embodiment of the present invention.

FIG. 5 shows a magnetic resonance recording that was determined on the basis of second magnetic resonance data in accordance with an embodiment of the present invention.

FIG. 6 shows a magnetic resonance recording that was determined in accordance with an embodiment of the present invention.

Figure 1:
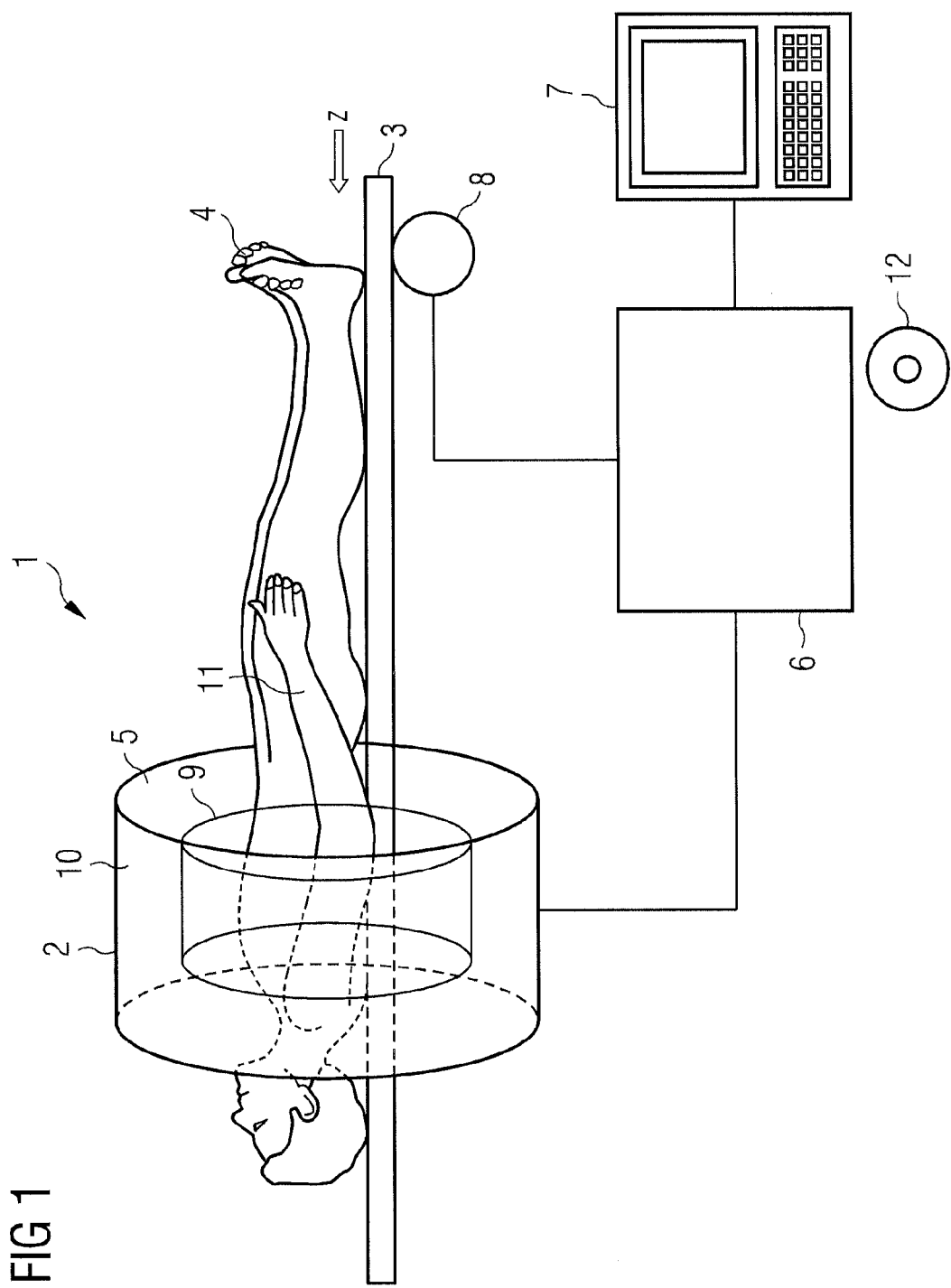
FIG. 1 schematically shows a magnetic resonance facility according to an embodiment of the present invention.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments may be described with reference to acts and symbolic representations of operations (e.g., in the form of flowcharts) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs) computers or the like.

Note also that the software implemented aspects of the example embodiments may be typically encoded on some form of program storage medium or implemented over some type of transmission medium. The program storage medium (e.g., non-transitory storage medium) may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

According to at least one embodiment of the present invention, a method is disclosed for determining magnetic resonance data of an examination object in a magnetic resonance facility; a magnetic resonance facility is disclosed; a computer program product is disclosed; and/or an electronically readable data medium is disclosed. The dependent claims define preferred and advantageous embodiments of the invention.

According to at least one embodiment of the present invention, a method is provided for determining magnetic resonance data of an examination object in a magnetic resonance facility. Using the method, a first readout gradient field is determined in such a way that a distortion which is caused by a non-linearity of the first readout gradient field and a distortion that is caused by a B0 field inhomogeneity are essentially cancelled at a predetermined first location of the field of view of the magnetic resonance facility. Moreover, a second readout gradient field is determined in such a way that a distortion which is caused by a non-linearity of the second readout gradient field and a distortion that is caused by a B0 field inhomogeneity are essentially cancelled at a predetermined second location of the field of view. The first location and the second location are different locations.

For example, the first location and the second location are in each case locations in a circumferential region which is delimited on one side by a normally usable field of view of the magnetic resonance facility and on the other side by a tunnel-shaped opening of the magnetic resonance facility that is used to accommodate the examination object. The two locations can be situated e.g. in a layer of a magnetic resonance recording.

Provision is preferably made for the first readout gradient field and the second readout gradient field to have an identical gradient direction and for the first location and the second location to be arranged at essentially opposite ends of the field of view of the magnetic resonance facility in the gradient direction.

At least one embodiment of the inventive method further provides for performing a multispin echo sequence in which first magnetic resonance data of a first spin echo is captured using the first readout gradient field after a 180° pulse and second magnetic resonance data of a second spin echo is captured using the second readout gradient field after a further 180° pulse.

Alternatively, the further 180° pulse can also be omitted, such that the second magnetic resonance data is captured in the context of a combined spin echo/gradient echo sequence using the second readout gradient field. The entire readout sequence can be simplified thus.

Ideally, the distortion due to the non-linearity of the readout gradient field and the distortion due to the B0 field inhomogeneity are completely cancelled at the respective location. However, complete cancellation is not absolutely essential and is often not technically possible. For the purpose of an advantageously usable distortion adjustment, it is therefore sufficient if the distortion due to the non-linearity of the readout gradient field and the distortion due to the B0 field inhomogeneity are largely cancelled at the respective location. This fact is expressed by the term "essentially cancel". For the purpose of the present description, the terms "cancel" and "essentially cancel" used in this context are therefore understood to have the meaning described above.

Since the non-linearity of the gradient field is dependent on the gradient field strength and the B0 field inhomogeneities are independent of the gradient field strength, the gradient field (at least for a predetermined location of the field of view or a predetermined region of the field of view, in particular also in the margin region of the field of view between the normally usable field of view and the inner side of the tunnel-shaped opening) can be determined and generated in such a way that the non-linearity of the gradient field and the B0 field inhomogeneity are cancelled at this location or in this region. It is therefore possible to prevent distortion in this predetermined location or in the predetermined region. However, a separate magnetic resonance data capture using the corresponding gradient field is required for each such predetermined location, and therefore the total time for capturing magnetic resonance data for a magnetic resonance recording increases significantly. In order to reduce this measuring time, provision is made for performing the multiecho sequence, wherein a readout gradient field that is optimized for a predetermined location is switched in each case after a 180° pulse. Due to various of these readout gradient fields for various locations or regions being switched after a 180° pulse in each case, it is possible to capture magnetic resonance data which provides distortion-free information for the various locations. Magnetic resonance data which is used for generating magnetic resonance recordings and contains only slight distortions can therefore be captured within a short time.

In this context, distortion is understood to mean that a signal value of an image point at a predefined location (x, y, z) of the examination object, e.g. at a predetermined location in the margin region described above, appears at a different location (x1, y1, z1) in the representation of the examination object that is determined from the captured magnetic resonance data. The coordinates (x, y, z) are also referred to as the actual position and the coordinates (x1, y1, z1) as the distorted position. Particularly in the margin region of the field of view, distortions can occur that cannot be rectified by subsequently correcting the representation of the examination object because e.g. a plurality of adjacent actual positions may be mapped onto one or more distorted positions which are located closely together. Since the non-linearity of the gradient field and the B0 field inhomogeneity at the predetermined location or region are mutually cancelled as a result of generating a suitable gradient field, no distortions or only slight distortions occur for this region and therefore a usable representation of the examination object can be determined in this region.

According to an embodiment, a strength and polarity are calculated for the first readout gradient field and a strength and polarity are likewise calculated for the second readout gradient field. The strengths and polarities thus calculated are taken into consideration when performing the multiecho sequence by means of switching the readout gradient fields correspondingly. Due to the inhomogeneity of the B0 field, the polarities of the first readout gradient field and of the second readout gradient field for the first location and the second location can have an opposite polarity at essentially opposite ends of the field of view of the magnetic resonance facility.

According to a further embodiment, it is therefore possible to check whether a gradient moment of the first readout gradient field and of the second readout gradient field for the second spin echo is cancelled. If the gradient moment is not cancelled, an additional gradient field is determined and switched in the readout direction before the second readout gradient is switched, such that the gradient moment of the first readout gradient field, of the additional gradient field and of the second readout gradient field for the second spin echo are cancelled. Such an additional gradient field is also referred to as a prephase. Such a prephase may also be required before the first readout gradient is switched, in order to ensure that the gradient moments are cancelled at the instant of the first spin echo. It is therefore possible to compensate for the B0 field inhomogeneities by means of the gradient non-linearities simultaneously in a measurement, and consequently to expand the measurable magnetic resonance-based field of view in the readout direction beyond the normally specified field of view through the margin region as far as the inner surface of the tunnel-shaped opening.

According to an embodiment, a first relative gradient error at the first location, a B0 field inhomogeneity at the first location, a second relative gradient error at the second location and a B0 field inhomogeneity at the second location are determined for the purpose of determining the first and second readout gradient fields. A first gradient G1 is determined for the first readout gradient field as a function of the first relative gradient error c1 (x1, y1, z1) and the B0 field inhomogeneity dB0 (x1, y1, z1) at the first location (x1, y1, z1). Likewise, a second gradient G2 is determined for the second readout gradient field as a function of the second relative gradient error c2 (x2, y2, z2) and the B0 field inhomogeneity dB0 (x2, y2, z2) at the second location (x2, y2, z2).

The first gradient G1 and the second gradient G2 can be determined e.g. in accordance with the following equations:

$$G1 = -dB0(x1,y1,z1)/c1(x1,y1,z1) \text{ and} \quad (1a)$$

$$G2 = -dB0(x2,y2,z2)/c2(x2,y2,z2) \quad (1b)$$

The B0 field inhomogeneity at various locations of the magnetic resonance facility and the relative gradient errors can be measured and stored once in advance for a magnetic resonance facility, for example. If the magnetic resonance facility has been measured once, i.e. the relative gradient error and the B0 field inhomogeneity have been determined for specific locations or regions, e.g. regions in which the arms of the patient are expected to lie, it is then easily possible to determine and generate readout gradient fields in order to generate magnetic resonance data in combination with a multiecho sequence, wherein said magnetic resonance data can be used to determine an image of the examination object having only slight distortions or no distortions. For this purpose, for example, image points of a magnetic resonance recording for the first location can be determined as a function of the first magnetic resonance data, and image points of the magnetic resonance recording for the second location can be determined as a function of the second magnetic resonance data. Distortion-free or low-distortion representations of the examination object can therefore be provided in each case for the various predetermined locations.

As mentioned above, a part region of the examination object may be located in the margin or margin region of the field of view of the magnetic resonance facility. This part region can contain e.g. an anatomical structure of a patient, e.g. an arm of the patient. The margin region or circumferential region can have a thickness of approximately 5 cm, for example, i.e. the circumferential region extends 5 cm from an inner surface of the tunnel-shaped opening of the magnetic resonance facility towards the center (the so-called isocenter) of the magnetic resonance facility, for example. The arms of a patient who is arranged in the tunnel-shaped opening of the magnetic resonance facility are normally arranged adjacent to the body on a patient couch of the magnetic resonance facility. As a result of this, the arms are normally situated at least partially in the circumferential region.

In the case of a magnetic resonance recording in a transverse plane relative to the patient, the first location can be disposed in the first arm of the patient and the second location in the second arm of the patient, such that suitable readout gradient fields can be determined, these being suitable for determining a distortion-free arrangement of the arms of the patient in the circumferential region. Using a suitable choice of readout direction, i.e. provided the first location and the second location are arranged at essentially opposite ends of the field of view of the magnetic resonance facility in the readout direction, magnetic resonance data providing distortion-free or low-distortion magnetic resonance recordings can be captured for both locations in a multiecho sequence.

According to further embodiment, an attenuation adjustment for a positron emission tomography (PET) recording is determined as a function of the position of the part region of the examination object, e.g. depending on the position of the arms of the patient. Due to the slight distortion, the position of the part regions can reliably be determined from the representation of the examination object. In the case of a positron emission tomography recording, it is critically important to give consideration to an attenuation of the received radiation (photons) through the structure or anatomy of the examination object in the beam direction. Since the position of the part region of the examination object can be determined even at the margin of the field of view of the magnetic resonance facility, it is possible fully to determine the position and structure of the examination object of the patient in the magnetic resonance facility, and therefore a precise attenuation adjustment can be determined for a positron emission tomography recording.

According to at least one embodiment of the present invention, provision is further made for a magnetic resonance facility comprising a basic field magnet, a gradient field system, a high-frequency antenna and a control device. The control device activates the gradient field system and the high-frequency antenna. The control device also receives measurement signals that are picked up by the high-frequency antenna, and evaluates the measurement signals in order to produce magnetic resonance recordings. The control device is further configured to determine a first readout gradient field in such a way that a distortion which is caused by a non-linearity of the first readout gradient field and a distortion that is caused by a B0 field inhomogeneity are cancelled at a predetermined first location of the field of view of the magnetic resonance facility. Moreover, the control device is able to determine a second readout gradient field in such a way that a distortion which is caused by a non-linearity of the second readout gradient field and a distortion that is caused by a B0 field inhomogeneity are cancelled at a predetermined second location of the field of view. The first location and the second location are different. Finally, the control device is able to activate the components of the magnetic resonance facility in the form of a multispin echo sequence. In this case, first magnetic resonance data is captured using the first readout gradient field after a 180° pulse and second magnetic resonance data is captured using the second readout gradient field after a further 180° pulse.

According to an embodiment, the magnetic resonance facility also comprises a positron emission tomograph. In this case, the control device can be configured to determine an attenuation adjustment for a positron emission tomography recording as a function of a magnetic resonance recording that was produced on the basis of the first magnetic resonance data and the second magnetic resonance data.

Furthermore, the magnetic resonance facility can be configured to perform the method and its embodiments as described above and therefore also features the advantages described above.

Furthermore, at least one embodiment of the present invention makes provision for a computer program product, in particular a computer program or software, which can be loaded into a memory of a programmable control device of a magnetic resonance facility. Using the computer program product, it is possible to execute all or various of the above described embodiments of the inventive method when the computer program product runs in the control unit.

In this case, the computer program product might require programming resources such as libraries or help functions, for example, in order to realize the corresponding embodiments of the method. In other words, the claim relating to the computer program product is intended to include in the scope of protection in particular a computer program or software by which one of the above described embodiments of the inventive method can be executed and/or which executes said embodiment. In this case, the software can be a source code (e.g. C++) which remains to be compiled or translated and linked or which merely needs to be interpreted, or an executable software code which merely needs to be loaded into the relevant processing unit for execution.

Lastly, at least one embodiment of the present invention provides an electronically readable data medium, e.g. a DVD, a magnetic tape or a USB stick, on which is stored electronically readable control information, in particular software, as described above. When this control information and/or software is read from the data medium and stored in the processing unit, all of the inventive embodiments of the described method can be performed.

FIG. 1 shows a schematic illustration of a magnetic resonance facility 1. The magnetic resonance facility 1 comprises the actual tomograph 2, an examination table 3 for a patient 4, this being situated in an opening 5 of the tomograph 2, a control unit 6, an evaluation device 7 and a drive unit 8. The control unit 6 activates the tomograph 2 and receives signals from the tomograph 2, which signals are picked up by the tomograph 2. The tomograph 2 comprises a basic field magnet (not shown) for generating a basic magnetic field B0, and the tomograph 2 comprises a gradient field system (not shown) for generating gradient magnetic fields. The tomograph 2 further comprises one or more high-frequency antennas for generating high-frequency signals and for receiving measurement signals that are used by the control device 6 and the evaluation device 7 for generating magnetic resonance recordings. Furthermore, the control device 6 activates the drive unit 8 in order to move the examination table 3 and the patient 4 in a direction Z through the opening 5 of the tomograph 2. The control device 6 and the evaluation device 7 can be e.g. a computer system comprising a display screen, a keyboard, a pointing device such as e.g. a mouse, and a data medium 12, on which is stored electronically readable control information that is so configured as to perform embodiments of the method described below when the data medium is used in the evaluation device 7 and the control device 6.

The magnetic resonance facility 1 is able to produce a magnetic resonance tomography recording within a volume that is delimited by the opening 5 in the interior of the tomograph 2. Due to physical and technical shortcomings, e.g. a magnetic field inhomogeneity of the basic magnetic field B0 extending in a Z direction and a non-linearity of gradient fields, the volume of the magnetic resonance facility 1 that can actually be used for magnetic resonance recordings is limited e.g. to a volume 9 which extends spherically in the interior of the opening 5.

As shown in FIG. 1, in particular a circumferential region or margin region 10 which is situated between the usable volume 9 and an inner wall of the tomograph 2 is unusable or can only be used to a limited extent due to the physical/technical shortcomings described above. If the magnetic resonance facility is used e.g. to determine the position and anatomy of the patient 4, in order to be used in combination with a positron emission tomograph (not shown), it is nonetheless necessary to determine the complete anatomy of the patient 4, i.e. the anatomy of the patient 4 is also required in the circumferential region 10 in particular, therefore including an arrangement of the arms 11 of the patient 4. On the basis of the captured anatomy of the patient 4, it is then possible to determine a human attenuation adjustment, this being critically important in the evaluation of a positron emission tomography recording.

As mentioned above, the tomograph 2 comprises a gradient system which includes three partial windings, for example. Each partial winding is supplied, by means of a corresponding amplifier of the control device 6, with current for generating a linear gradient field in the relevant direction of a Cartesian system of coordinates. In this case, the first partial winding of the gradient field system generates a gradient in an x-direction, the second partial winding generates a gradient in a y-direction and the third partial winding generates a gradient in a z-direction. The high-frequency antenna includes e.g. one or more high-frequency transmit coils and a plurality of high-frequency receive coils in the form of an annular, linear or matrix-type arrangement of coils, for example. The high-frequency receive coils of the high-frequency antenna are used to convert the alternating field that is produced by the precessing nuclear spin into a measurement signal using one or more analog-digital converters (ADC).

The operation of the magnetic resonance facility 1 is explained in greater detail below with reference to the FIGS. 2 and 3. The magnetic resonance facility 1 is operated in a multiecho sequence operating mode for the purpose of generating magnetic resonance data. The underlying method relating to a multiecho sequence is known to a person skilled in the art and is therefore not described in detail below. In the following description, the multiecho sequence is described as a double echo sequence. However, multiple echo sequences featuring more than two echoes are likewise possible for further predetermined positions.

Figure 2:
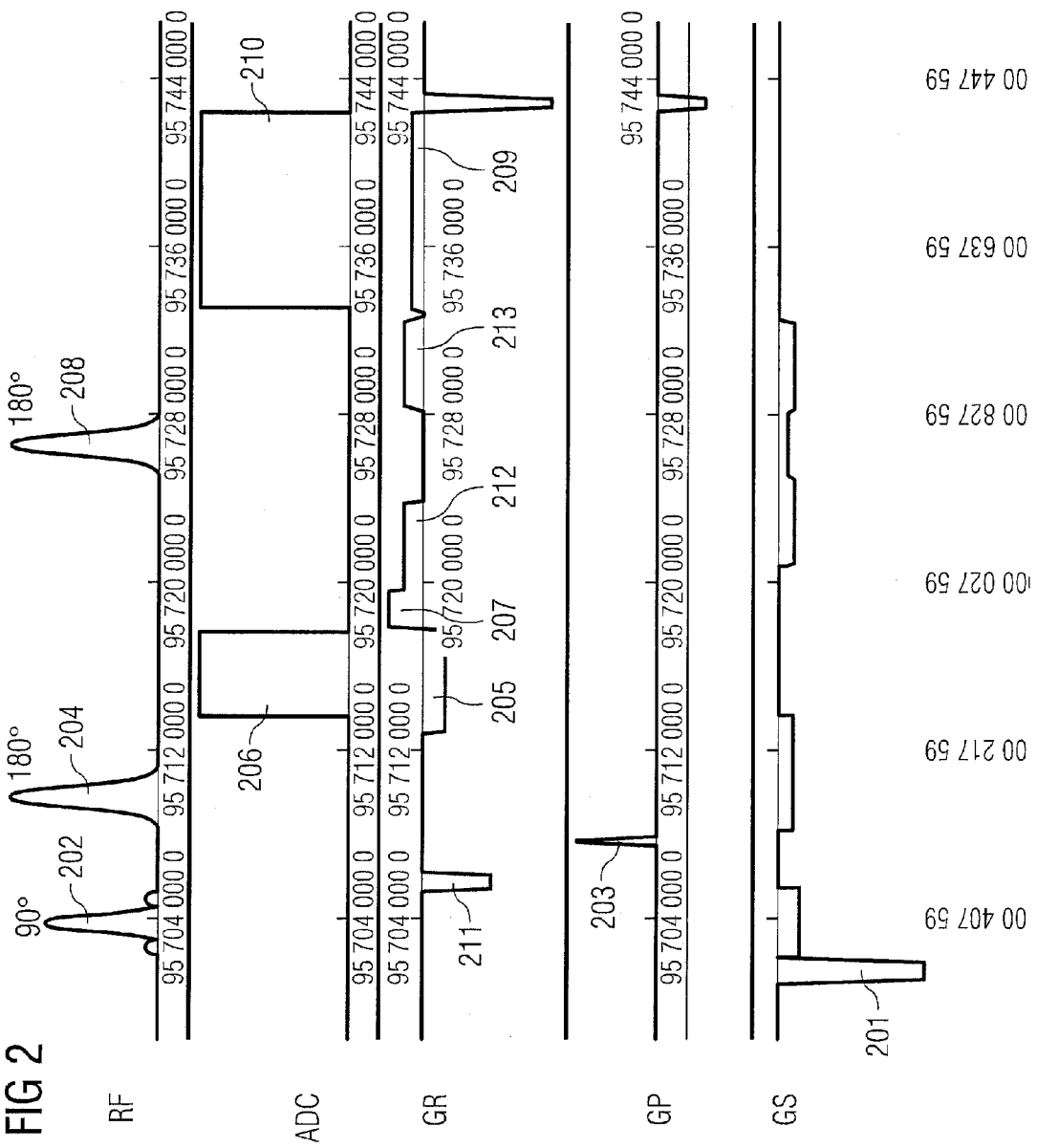
FIG. 2 shows signal forms of a multispin echo sequence according to an embodiment of the present invention.

In FIG. 2, five signal forms are shown one beneath the other, above a shared time axis. The first signal form (RF) shows high-frequency pulses which are transmitted via the high-frequency antenna onto the patient 4. The second signal form (ADC) shows the measurement signals which are received by the high-frequency antenna, forwarded to an analog-digital converter (ADC) and used as a basis for determining magnetic resonance data for generating magnetic resonance recordings. The third signal form (GR) shows a course of the readout gradient field (read-out gradient). The fourth signal form (GP) shows a signal form of a phase encoding gradient. The fifth signal form (GS) shows a course of a layer selection gradient.

The non-linearities of the gradient field and the inhomogeneity of the B0 field are assumed to be determined as above. Corresponding parameters can be determined once in advance by measuring the magnetic resonance facility 1, for example.

The above cited distortions, which occur in particular in the circumferential region or margin region 10, depend on the field deviation dBg or dB0 relative to an ideal value or nominal value and on the gradient field strength G. The following equations describe in an exemplary manner a two-dimensional magnetic resonance data capture featuring layer selection in a z-direction, phase encoding in a y-direction and frequency encoding in an x-direction. The phase encoding direction, the frequency encoding direction and the layer selection direction are freely selectable and merely adapt the axial position to the equations.

$$z1 = z + dBgz(x,y,z)/Gz + dB0(x,y,z)/Gz \qquad (2)$$

$$x1 = x + dBgx(x,y,z)/Gx + dB0(x,y,z)/Gx \qquad (3)$$

$$y1 = y + dBgy(x,y,y)/Gy \qquad (4)$$

The coordinates x,y,z designate the actual positions and the coordinates x1,y1,z1 designate the distorted positions.

Since the non-linearity dBg of the gradient field is scalable as a function of the gradient field strength, the distortion for a specific region or location can be selectively reduced or compensated as shown below. It applies that:

$$dBgx = c(x,y,z) \cdot Gx \qquad (5)$$

where c(x,y,z) designates the relative gradient error at the position x,y,z and Gx represents the gradient field strength.

The B0 field inhomogeneities are however constant, irrespective of the gradient strength. The term dBgx/Gx is therefore constant and independent of the gradient field strength.

However, the term dB0/Gx can be changed by the gradient field strength.

According to an embodiment of the present invention, the magnetic fields are therefore superimposed in such a way that the non-linearity of the gradient field and the B0 field inhomogeneity are destructively superimposed at a predetermined location or a predetermined region. This is described below by way of example for a readout gradient in an x-direction and a layer selection in a z-direction. The desired destructive superimposition of the magnetic fields is successful when an optimal gradient strength Gx_opt exists, for which the distortion at the predetermined location or within the predetermined region is zero. For a distortion of zero in the x-direction, it applies that:

x1=x

It follows that:

$$Gx\_opt = -dB0(x,y,z)/c(x,y,z) \quad (6)$$

If the gradient field strength Gx is selected as described in equation (6), a significantly enlarged field of view is produced for the predetermined position or the predetermined region, i.e. the distortion decreases considerably in this region.

Figure 3:
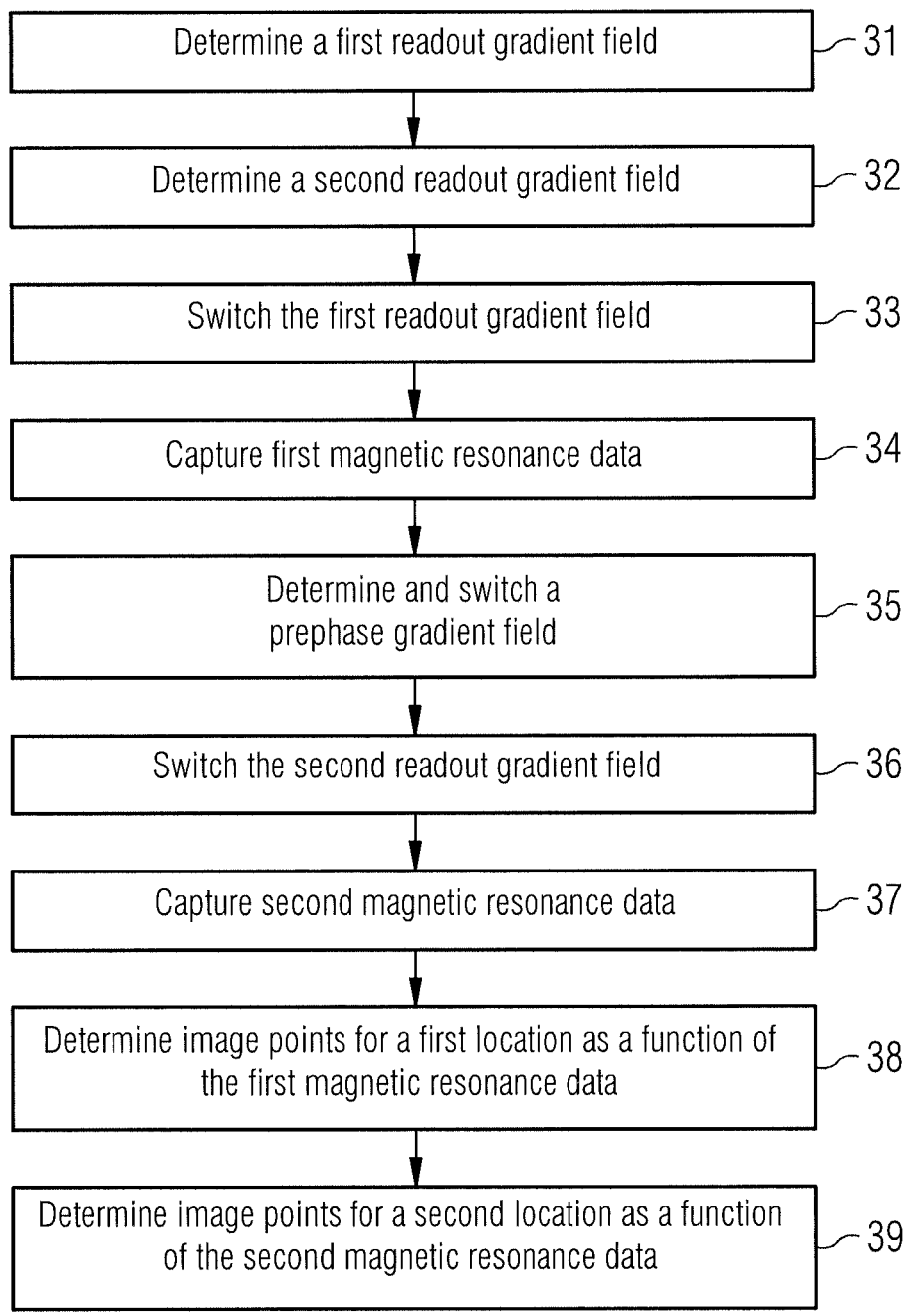
FIG. 3 shows a flow diagram of a method according to an embodiment of the invention.

In step 31 of the method shown in FIG. 3, a first readout gradient field is therefore determined, e.g. in accordance with equation (6), for a first location or a first region in the circumferential region 10 along the inner surface of the tunnel-shaped opening of the tomograph 2. The first location or first region is e.g. a region in which it is anticipated that an arm of the patient 4 will be arranged. In step 32, a second readout gradient field is determined for a second location. The second location is e.g. a location or region in which the other arm of the patient 4 is situated. The second readout gradient field can likewise be determined in accordance with equation (6). The first readout gradient field and the second readout gradient field are each determined in such a way that a distortion that is caused by a non-linearity of the respective readout gradient field and a distortion that is caused by a B0 field inhomogeneity are cancelled at the corresponding predetermined first location and/or second location.

A multiecho sequence is now introduced. As shown in FIG. 2, a layer selection gradient 201 is switched first and then a 90° high-frequency pulse 202 is transmitted. Then a phase encoding gradient 203 is switched and a 180° pulse 204 is transmitted. Then the first readout gradient field 205 is switched (step 33) and first spin echo signals 206 are received and captured as first magnetic resonance data (step 34). Depending on the polarity of the second readout gradient field, a prephase gradient moment 207 is additionally inserted in step 35, such that the gradient moment is zero at the instant of the second echo that will be received during the second readout gradient field. Then a further 180° pulse 208 is transmitted and the second readout gradient field 209 is switched (step 36). While the second readout gradient field applies, second measurement signals 210 are captured and second magnetic resonance data is determined therefrom (step 37). In order to ensure that the gradient moment is likewise zero at the instant of the first echo 206, it may be necessary between the 90° pulse 202 and the first 180° pulse 204 to switch a prephase 211 for the first echo 206. Likewise, it may be necessary to switch the so-called spoiler fields 212 and 213 in order to prevent such nuisance artifacts as can occur in the context of multiecho sequences.

Image points for the first location are determined in step 38 as a function of the first magnetic resonance data, and image points for the second location are determined in step 39 as a function of the second magnetic resonance data. The image points which are thus determined for the first location and the second location are characterized by zero distortion or low distortion because a destructive superimposition of the B0 field inhomogeneities and the gradient non-linearities occurred at the corresponding locations during the capture of the corresponding magnetic resonance data.

Results of the method described above are illustrated below in FIGS. 4-6 in the form of magnetic resonance images. In this case, transverse magnetic resonance recordings were determined on the basis of magnetic resonance data from the previously described multiecho sequence. The inner diameter of the tomograph 2 is in the region of 600 mm and the normally usable field of view of the magnetic resonance facility 1 is 500 mm. Three phantom objects 41, 42, 43 are arranged in the tomograph 2. The phantom object 42 is arranged in the isocenter of the magnetic resonance facility 1. The phantom object 41 is situated in a negative x-direction at the inner margin of the tomograph 2. The phantom object 43 is situated in a positive x-direction at the inner margin of the tomograph 2.

FIG. 4 shows a magnetic resonance recording 40 of the three phantom objects 41-43 on the basis of the first magnetic resonance data, which was captured using the first echo and the first readout gradient field 205. The phantom object 42 in the center of the field of view was captured with zero distortion. Since the first readout gradient field was optimized for a location in the margin region in a negative x-direction, the phantom object 41 is shown with relatively slight distortions in the magnetic resonance recording 40. Particularly in the region indicated by the arrow 44 outside of the normally usable field of view, the structure of the phantom object 41 is only slightly distorted. However, the phantom object 43 is very significantly distorted (arrow 45) in the region outside of the 500 mm circle of the normally usable field of view.

FIG. 5 shows a magnetic resonance recording 50 which was produced on the basis of the second magnetic resonance data. During the capture of the second magnetic resonance data, a readout gradient field was applied which was optimized for a location in a positive x-direction. The phantom object 42 in the center is again shown with no distortion. The phantom object 43 is now only relatively slightly distorted in the margin region indicated by the arrow 52. However, the phantom object 41 is very significantly distorted in the region indicated by the arrow 51.

FIG. 6 shows a magnetic resonance image 60 which was produced on the basis of the first magnetic resonance data and the second magnetic resonance data. The negative x-region was produced on the basis of the first magnetic resonance data and the positive x-region was produced on the basis of the second magnetic resonance data. The structure of the phantom objects 41-43 is now only slightly distorted overall, particularly in those regions indicated by the arrows 61 and 62 outside of the normally usable field of view.

By virtue of using the two echoes, it is therefore possible to extend the field of view in both a positive and a negative x-direction in the context of a magnetic resonance facility, up to a total diameter of 600 mm in the above example.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

LIST OF REFERENCE CHARACTERS

1 Magnetic resonance facility
2 Tomograph
3 Patient couch
4 Examination object, patient
5 Tunnel-shaped opening
6 Control device
7 Evaluation device
8 Drive unit
9 Field of view, homogeneous region
10 Field of view, inhomogeneous region, circumferential region
11 Arm
12 Data medium
31-39 Step
40 Magnetic resonance recording
41-43 Phantom object
44, 45 Arrow
50 Magnetic resonance recording
51, 52 Arrow
60 Magnetic resonance recording
61, 62 Arrow
201 Layer selection gradient field
202 90° pulse
203 Phase encoding gradient field
204 180° pulse
205 First readout gradient field
206 First magnetic resonance data
207 Prephase gradient field
208 180° pulse
209 Second readout gradient field
210 Second magnetic resonance data
211 Prephase gradient field
212, 213 Spoiler gradient field

What is claimed is:

1. A method for determining magnetic resonance data of an examination object in a magnetic resonance facility, comprising:
    determining a first readout gradient field in such a way that a distortion caused by a non-linearity of the first readout gradient field and a distortion caused by a $B_0$ field inhomogeneity are essentially cancelled at a first location of a field of view of the magnetic resonance facility;
    determining a second readout gradient field in such a way that a distortion caused by a non-linearity of the second readout gradient field and a distortion caused by a $B_0$ field inhomogeneity are essentially cancelled at a second location of the field of view, the second location being different than the first location; and
    performing a multiecho sequence, wherein first magnetic resonance data of a first spin echo is captured using the determined first readout gradient field after a 180° pulse and second magnetic resonance data of a second spin echo is captured using the determined second readout gradient field after a further 180° pulse.

2. A method for determining magnetic resonance data of an examination object in a magnetic resonance facility, comprising:

determining a first readout gradient field in such a way that a distortion caused by a non-linearity of the first readout gradient field and a distortion caused by a $B_0$ field inhomogeneity are essentially cancelled at a first location of a field of view of the magnetic resonance facility;

determining a second readout gradient field in such a way that a distortion caused by a non-linearity of the second readout gradient field and a distortion caused by a $B_0$ field inhomogeneity are essentially cancelled at a second location of the field of view, the second location being different than the first location; and performing a combined spin echo/gradient echo sequence, wherein first magnetic resonance data of a first spin echo is captured using the determined first readout gradient field after a 180° pulse of the spin echo sequence, and second magnetic resonance data is then captured using the determined second readout gradient field.

3. The method of claim 1, wherein the first location and the second location are arranged in a layer of a magnetic resonance recording, determined on the basis of the captured first and second magnetic resonance data.

4. The method of claim 1, wherein the first readout gradient field and the second readout gradient field have a common gradient direction, wherein the first location and the second location are arranged at essentially opposite ends of the field of view of the magnetic resonance facility in the gradient direction.

5. The method of claim 1, wherein the determining of the first readout gradient field involves a calculation of a strength and polarity of the first readout gradient field, and wherein a determining of the second readout gradient field involves a calculation of a strength and polarity of the second readout gradient field.

6. The method of claim 1, wherein provision is further made for checking whether a gradient moment of the first readout gradient field and of the second readout gradient field for the second spin echo is cancelled, and the method further comprising, if the gradient moment is not cancelled, using an additional gradient field in a readout direction before the second readout gradient field, such that the gradient moment of the first readout gradient field, of the additional gradient field and of the second readout gradient field for the second spin echo, are cancelled.

7. The method of claim 1, wherein the steps for determining the first and second readout gradient field further comprise:
 determining a first relative gradient error at the first location,
 determining a $B_0$ field inhomogeneity at the first location,
 determining a second relative gradient error at the second location,
 determining a $B_0$ field inhomogeneity at the second location,
 determining a first gradient of the first readout gradient field as a function of the first relative gradient error and the $B_0$ field inhomogeneity at the first location, and
 determining a second gradient of the second readout gradient field as a function of the second relative gradient error and the $B_0$ field inhomogeneity at the second location.

8. The method of claim 7, wherein the first gradient $G_1$ and the second gradient $G_2$ are determined in accordance with the equations $$G_1 = -dB_0(x_1,y_1,z_1)/c_1(x_1,y_1,z_1) \text{ and}$$

$$G_2 = -dB_0(x_2,y_2,z_2)/c_2(x_2,y_2,z_2)$$

where $dB_0(x_1,y_1,z_1)$ is the $B_0$ field inhomogeneity at the first location $x_1,y_1,z_1$, $c_1$ is the first relative gradient error at the first location $x_1,y_1,z_1$, $dB_0(x_2,y_2,z_2)$ is the $B_0$ field inhomogeneity at the second location $x_2,y_2,z_2$, and $c_2$ is the second relative gradient error at the second location $x_2,y_2,z_2$.

9. The method of claim 1, wherein the magnetic resonance facility features a tunnel-shaped opening for accommodating the examination object, wherein a margin of the field of view of the magnetic resonance facility comprises a circumferential region along an inner surface of the tunnel-shaped opening, and wherein the first location and the second location are situated in the margin of the field of view.

10. The method of claim 9, wherein a part region of the examination object is arranged in the margin of the field of view of the magnetic resonance facility, and wherein the part region comprises an anatomical structure of a patient.

11. The method of claim 10, wherein the anatomical structure comprises an arm of the patient.

12. The method of claim 9, wherein the circumferential region includes a thickness of approximately 5 cm.

13. The method of claim 10, wherein image points of a magnetic resonance recording for the first location are determined as a function of the first magnetic resonance data, and image points of the magnetic resonance recording for the second location are determined as a function of the second magnetic resonance data.

14. The method of claim 13, wherein the magnetic resonance recording is determined in a transverse plane relative to the examination object.

15. The method of claim 13, wherein a representation of the part region of the examination object at the first location and the second location is determined as a function of the magnetic resonance recording.

16. The method of claim 15, wherein an attenuation adjustment for a positron emission tomography recording is determined as a function of the representation of the part region of the examination object.

17. A magnetic resonance facility, comprising:
 a basic field magnet;
 a gradient field system;
 a high-frequency antenna; and
 a control device configured to activate the gradient field system and the high-frequency antenna, configured to receive measurement signals picked by the high-frequency antenna, configured to evaluate the measurement signals, and configured to produce magnetic resonance recordings, the control device being further configured
  to determine a first readout gradient field in such a way that a distortion caused by a non-linearity of the first readout gradient field and a distortion caused by a $B_0$ field inhomogeneity are essentially cancelled at a first location of a field of view of the magnetic resonance facility,
  to determine a second readout gradient field in such a way that a distortion caused by a non-linearity of the second readout gradient field and a distortion caused by a $B_0$ field inhomogeneity are essentially cancelled at a second location of the field of view, the second location being different than the first location, and
  to perform a multiecho sequence, wherein first magnetic resonance data is captured using the determined first readout gradient field after a 180° pulse and second magnetic resonance data is captured using the determined second readout gradient field after a further 180° pulse.

18. A magnetic resonance facility, comprising:
a basic field magnet;
a gradient field system;
a high-frequency antenna; and
a control device configured to activate the gradient field system and the high-frequency antenna, configured to receive measurement signals picked by the high-frequency antenna, configured to evaluate the measurement signals, and configured to produce magnetic resonance recordings, the control device being configured
to determine a first readout gradient field in such a way that a distortion caused by a non-linearity of the first readout gradient field and a distortion caused by a $B_0$ field inhomogeneity are essentially cancelled at a first location of a field of view of the magnetic resonance facility,
to determine a second readout gradient field in such a way that a distortion caused by a non-linearity of the second readout gradient field and a distortion caused by a $B_0$ field inhomogeneity are essentially cancelled at a second location of the field of view, the second location being different than the first location, and
to perform a combined spin echo/gradient echo sequence, wherein first magnetic resonance data of a first spin echo is captured using the determined first readout gradient field after a 180° pulse of the spin echo sequence, and second magnetic resonance data is then captured using the determined second readout gradient field.

19. The magnetic resonance facility as claimed in claim 17, wherein the magnetic resonance facility further comprises a positron emission tomograph.

20. The magnetic resonance facility as claimed in claim 18, wherein the magnetic resonance facility further comprises a positron emission tomograph.

21. A non-transitory computer program product, directly loadable into a memory of a programmable control device of a magnetic resonance facility, comprising program segments for executing the method as claimed in claim 1 when the program is executed in a control device of the magnetic resonance facility.

22. A non-transitory electronically readable data medium including electronically readable control information stored thereon and configured as to perform, when executed, the method as claimed in claim 1 when the data medium is used in a control device of a magnetic resonance facility.

23. The method of claim 1, wherein moreover image points of a magnetic resonance recording for the first location are determined as a function of the first magnetic resonance data, and image points of the magnetic resonance recording for the second location are determined as a function of the second magnetic resonance data.

24. The method of claim 2, wherein the first location and the second location are arranged in a layer of a magnetic resonance recording, determined on the basis of the captured first and second magnetic resonance data.

25. The method of claim 2, wherein the first readout gradient field and the second readout gradient field have a common gradient direction, wherein the first location and the second location are arranged at essentially opposite ends of the field of view of the magnetic resonance facility in the gradient direction.

26. The method of claim 2, wherein the determining of the first readout gradient field involves a calculation of a strength and polarity of the first readout gradient field, and wherein a determining of the second readout gradient field involves a calculation of a strength and polarity of the second readout gradient field.

27. The method of claim 2, wherein provision is further made for checking whether a gradient moment of the first readout gradient field and of the second readout gradient field for the second spin echo is cancelled, and the method further comprising, if the gradient moment is not cancelled, using an additional gradient field in a readout direction before the second readout gradient field, such that the gradient moment of the first readout gradient field, of the additional gradient field and of the second readout gradient field for the second spin echo, are cancelled.

28. The method of claim 2, wherein the steps for determining the first and second readout gradient field further comprise:
determining a first relative gradient error at the first location,
determining a $B_0$ field inhomogeneity at the first location,
determining a second relative gradient error at the second location,
determining a $B_0$ field inhomogeneity at the second location,
determining a first gradient of the first readout gradient field as a function of the first relative gradient error and the $B_0$ field inhomogeneity at the first location, and
determining a second gradient of the second readout gradient field as a function of the second relative gradient error and the $B_0$ field inhomogeneity at the second location.

29. The method of claim 28, wherein the first gradient $G_1$ and the second gradient $G_2$ are determined in accordance with the equations $$G_1 = -dB0(x_1,y_1,z_1)/c_1(x_1,y_1,z_1) \text{ and}$$

$$G_2 = -dB0(x_2,y_2,z_2)/c_2(x_2,y_2,z_2),$$

where $dB_0(x_1,y_1,z_1)$ is the $B_0$ field inhomogeneity at the first location $x_1,y_1,z_1$, $c_1$ is the first relative gradient error at the first location $x_1,y_1,z_1$ $dB_0(x_2,y_2,z_2)$ is the $B_0$ field inhomogeneity at the second location $x_2,y_2,z_2$, and $c_2$ is the second relative gradient error at the second location $x_2,y_2,z_2$.

30. The method of claim 2, wherein the magnetic resonance facility features a tunnel-shaped opening for accommodating the examination object, wherein a margin of the field of view of the magnetic resonance facility comprises a circumferential region along an inner surface of the tunnel-shaped opening, and wherein the first location and the second location are situated in the margin of the field of view.

31. The method of claim 30, wherein a part region of the examination object is arranged in the margin of the field of view of the magnetic resonance facility, and wherein the part region comprises an anatomical structure of a patient.

32. The method of claim 31, wherein the anatomical structure comprises an arm of the patient.

33. The method of claim 30, wherein the circumferential region includes a thickness of approximately 5 cm.

34. The method of claim 31, wherein image points of a magnetic resonance recording for the first location are determined as a function of the first magnetic resonance data, and image points of the magnetic resonance recording for the second location are determined as a function of the second magnetic resonance data.

35. The method of claim 34, wherein the magnetic resonance recording is determined in a transverse plane relative to the examination object.

36. The method of claim 34, wherein a representation of the part region of the examination object at the first location and the second location is determined as a function of the magnetic resonance recording.

37. The method of claim 36, wherein an attenuation adjustment for a positron emission tomography recording is determined as a function of the representation of the part region of the examination object.

38. A non-transitory computer program product, directly loadable into a memory of a programmable control device of a magnetic resonance facility, comprising program segments for executing the method as claimed in claim 2 when the program is executed in a control device of the magnetic resonance facility.

39. A non-transitory electronically readable data medium including electronically readable control information stored thereon and configured as to perform, when executed, the method as claimed in claim 2 when the data medium is used in a control device of a magnetic resonance facility.

40. A non-transitory computer readable medium including program segments for, when executed on a computer device, causing the computer device to implement the method of claim 1.

41. A non-transitory computer readable medium including program segments for, when executed on a computer device, causing the computer device to implement the method of claim 2.

* * * * *